US010509310B2

(12) United States Patent
Driessen et al.

(10) Patent No.: US 10,509,310 B2
(45) Date of Patent: Dec. 17, 2019

(54) PATTERNING DEVICES FOR USE WITHIN A LITHOGRAPHIC APPARATUS, METHODS OF MAKING AND USING SUCH PATTERNING DEVICES

(71) Applicant: ASML Netherlands B.V., Veldhoven (NL)

(72) Inventors: Frank Arnoldus Johannes Maria Driessen, Kranenburg-Niel (DE); Duan-Fu Stephen Hsu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 151 days.

(21) Appl. No.: 15/561,907

(22) PCT Filed: Mar. 8, 2016

(86) PCT No.: PCT/EP2016/054899
§ 371 (c)(1),
(2) Date: Sep. 26, 2017

(87) PCT Pub. No.: WO2016/162157
PCT Pub. Date: Oct. 13, 2016

(65) Prior Publication Data
US 2018/0120691 A1  May 3, 2018

Related U.S. Application Data

(60) Provisional application No. 62/144,192, filed on Apr. 7, 2015.

(51) Int. Cl.
*G03F 1/24* (2012.01)
*G03F 7/20* (2006.01)
*G03F 1/34* (2012.01)

(52) U.S. Cl.
CPC .............. *G03F 1/24* (2013.01); *G03F 1/34* (2013.01); *G03F 7/70033* (2013.01); *G03F 7/70433* (2013.01)

(58) Field of Classification Search
CPC ..... G03F 1/22; G03F 1/24; G03F 1/26; G03F 1/34; G03F 7/70033; G03F 7/70433
USPC .......................................................... 430/5
See application file for complete search history.

(56) References Cited

U.S. PATENT DOCUMENTS

| | | | |
|---|---|---|---|
| 7,060,401 | B1 | 6/2006 | LaFontaine et al. |
| 2003/0039923 | A1 | 2/2003 | Mangat et al. |
| 2004/0062998 | A1 | 4/2004 | Chapman et al. |
| 2009/0305147 | A1 | 12/2009 | Constancias |

FOREIGN PATENT DOCUMENTS

| | | |
|---|---|---|
| EP | 1 635 222 | 3/2006 |
| TW | 201443252 | 11/2014 |

OTHER PUBLICATIONS

International Search Report and Written Opinion dated Jun. 2, 2016 in corresponding International Patent Application No. PCT/EP2016/054899.
La Fontaine, Bruno et al., "Demonstration of Phase-Shift Masks for Extreme-Ultraviolet Lithography", Proceedings of SPIE, vol. 6151, pp. 61510A-1-61510A-8 (2006).
Kim, Guk-Jin et al., "Etched multilayer mask is better than conventional absorber mask", Proceedings of the SPIE, vol. 9256, pp. 92560R-1-92560R-7 (2014).
Takahashi, Toshiya et al., "Evaluations of negative tone development resist and process for EUV lithography", Proceedings of SPIE, vol. 9048, pp. 90482C-1-90482C-8 (2014).
Oh, Changil et al., "Comparison of EUV Patterning Performance between PTD and NTD for 1Xnm DRAM", Proceedings of SPIE, vol. 9048, pp. 904808-1-904808-8 (2014).
Han, Sang-In et al., "Design and Method of Fabricating Phase Shift Masks for Extreme Ultraviolet Lithography by Partial Etching into the EUV Multilayer Mirror", Proceedings of SPIE, vol. 5037, pp. 314-330 (2003).
LaFontaine et al., "Printing EUV Phase-Shift Masks using the 0.3NA Berkeley MET", presented at the 4th International EUVL Symposium—San Diego (2005).
Han, Sang-In et al., "Development of Phase Shift Masks for Extreme Ultra Violet Lithography and Optical Evaluation of Phase Shift Materials", Proceedings of SPIE, vol. 5374, pp. 261-270 (2004).
Deng, Yunfei et al., "EUV Phase-shifting Masks and Aberration Monitors", Proceedings of SPIE, vol. 4688, pp. 495-502 (2002).
Sugawara, Minoru et al., "Phase shift mask in EUV lithography", Proceedings of SPIE, vol. 5037, pp. 850-859, (2003).

(Continued)

*Primary Examiner* — Christopher G Young
(74) *Attorney, Agent, or Firm* — Pillsbury Winthrop Shaw Pittman LLP

(57) ABSTRACT

A patterning device carries a pattern of features to be transferred onto a substrate using a lithographic apparatus. The patterning device is free of light absorber material, at least in an area. The pattern of features in the area may include a dense array of lines, trenches, dots or holes. Individual lines, holes, etc. are defined in at least one direction by pairs of edges between regions of different phase in the patterning device. A distance between the pair of edges in the at least one direction is at least 15% smaller than a size of the individual feature to be formed on the substrate once adjusted by a magnification factor, if any, of the lithographic apparatus. The patterning device may be adapted for use in EUV lithography. The patterning device may be adapted for use in a negative tone resist and development process.

21 Claims, 10 Drawing Sheets

(56) References Cited

OTHER PUBLICATIONS

Constancias, C. et al., "Phase shift mask for EUV lithography", Proceedings of SPIE, vol. 6151, pp. 61511W-1-61511W-12 (2006).
Yan, Pei-Yang et al., "EUV Actinic Imaging Tool Aerial Image Evaluation of EUVL Embedded Phase Shift Mask Performance", Proceedings of SPIE, vol. 8322, pp. 83221P-1-83221P-8 (2012).
Erdmann, Andreas et al., "Imaging Characteristics of Binary and Phase Shift Masks for EUV Projection Lithography", Proceedings of SPIE, vol. 8550, pp. 85503K-1-85503K-10 (2012).
Bekaert, Joost et al., "Comparing positive and negative tone development process for printing the metal and contact layers of the 32- and 22-nm nodes", Journal of Micro/Nanolithography, MEMS, and MOEMS, vol. 9, No. 4, pp. 043007-1-043007-10 (2010).

(a)

(b)

(c)

(a)

(b)

(c)

(d)

(a)

(b)

(c)

(d)

PATTERNING DEVICES FOR USE WITHIN A LITHOGRAPHIC APPARATUS, METHODS OF MAKING AND USING SUCH PATTERNING DEVICES

CROSS-REFERENCE TO RELATED APPLICATIONS

This application is the U.S. national phase entry of PCT patent application no, PCT/EP2016/054899, which was filed on Mar. 8, 2016, which claims the benefit of priority of U.S. provisional application No. 62/144,192, which was filed on Apr. 7, 2015, and which is incorporated herein in its entirety by reference.

FIELD

The present invention relates to patterning devices for use within a lithographic apparatus. The invention further relates to methods of making and using such patterning devices, and to devices manufactured by such methods. The invention further relates to a computer program product for use in design and making of such patterning devices.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Lithography is widely recognized as one of the key steps in the manufacture of ICs and other devices and/or structures.

In order to reduce the minimum printable size, imaging may be performed using radiation having a short wavelength. It has therefore been proposed to use an EUV radiation source providing EUV radiation within the range of 13-14 nm, for example. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation.

Optical components for conditioning and focusing EUV radiation tend to be lossy, and much of the radiation is lost in the optical system. Further, available EUV radiation sources are limited in power. Consequently, production of high contrast images in resist material remains a challenge. A trade-off exists between the radiation dose required for good contrast, and the speed of exposure required for commercial productivity. Consequently, it is often more economic to produce device features by multiple exposures in a conventional (DUV) lithographic apparatus, rather than a single exposure in an EUV lithographic apparatus. As desired device features continue to shrink, however, the desire for the higher resolution of EUV lithography increases.

SUMMARY

The present disclosure aims to improve performance of lithographic apparatus and methods, including EUV lithographic apparatus and methods, within the constraints such as to source power.

In a first aspect of the invention there is provided a patterning device carrying a pattern of features to be transferred onto a target portion of a substrate using a lithographic apparatus and a negative tone process, at least an area of the patterning device being free of light absorber material and configured to define features of the pattern in that area by phase differences alone.

Embodiments of the invention may be used to define a dense array of features in a device pattern, such as an array of lines or trenches, or a two-dimensional array of dots or holes.

An individual feature in the said area may be defined at least in one direction by a pair of edges between regions of different phase, and negative bias may be applied in the patterning device design so that a distance between the pair of edges is at least 15% smaller, optionally at least 30% smaller, than a size of the feature to be formed on the substrate. (The comparisons of size and distance between the patterning device and the substrate are to be performed after correcting for a magnification factor of the lithographic apparatus used to transfer the pattern.)

Embodiments of the patterning device may be adapted for EUV lithography. In some embodiments, the patterning device comprises a multilayer reflective structure formed on a patterning device substrate, wherein features of the pattern are defined by etching the multilayer reflective structure in selected regions so as to impart substantially opposite phases to reflected radiation from etched and non-etched regions, taking into account a wavelength and angle of incidence to be used in said lithographic apparatus.

The invention in the first aspect further provides a method of manufacturing devices wherein a device pattern is applied to a series of substrates using a lithographic apparatus and using a lithographic process, the method including using the patterning device according to the first aspect of the invention as set forth above to apply the device pattern onto a resist material, and developing the applied pattern and processing the substrate in accordance with the developed pattern, wherein the pattern is formed in the resist by a negative tone process.

The invention in the first aspect further provides a method of manufacturing a patterning device for use with a lithographic apparatus, the method comprising:

defining a desired device pattern comprising a plurality of features to be formed in a layer of resist material in an area within a target portion of a substrate;

calculating a radiation pattern for realizing the device pattern of said area in a negative tone process;

calculating a patterning device design for realizing the calculated radiation pattern by phase differences alone, given a predetermined wavelength and incidence angle; and manufacturing the patterning device according to the calculated patterning device design, the patterning device being free of absorber material in an area corresponding to said area.

The patterning device design may be calculated in various ways. In one embodiment the design is optimized by simulating the radiation pattern (which may be referred to as an aerial image f the patterning device) while varying a distance between pairs of edges so as to maximize a contrast measure in the radiation pattern.

The invention in a second aspect further provides a patterning device carrying a pattern of features to be transferred onto a target portion of a substrate using a lithographic apparatus, at least an area of the patterning device being free of light absorber material, wherein the pattern of features in the said area comprises a dense array of individual features of which the individual features are defined in at least one direction by pairs of edges between regions of different phase.

Embodiments of the patterning device may have features similar to those of the first aspect of the invention. The patterning device may be adapted for use in a negative tone process or a positive tone process.

The invention in the second aspect further provides a method of manufacturing devices wherein a device pattern is applied to a series of substrates using a lithographic apparatus and using a lithographic process, the method including using the patterning device according to the first aspect of the invention as set forth above to apply the device pattern onto a resist material, and developing the applied pattern and processing the substrate in accordance with the developed pattern.

The invention in the second aspect further provides a method of manufacturing a patterning device for use with a lithographic apparatus, the method comprising:

defining a desired device pattern comprising a dense array of features to be formed in a layer of resist material in an area within a target portion of a substrate;

calculating a radiation pattern for realizing the device pattern of said area in the resist material;

calculating a patterning device design for realizing the calculated radiation pattern by phase differences alone, given a predetermined wavelength and incidence angle; and manufacturing the patterning device according to the calculated patterning device design, the patterning device being free of absorber material in an area corresponding to said area.

The above and other aspects and advantages of the present invention will be understood by the skilled reader from a consideration of the examples described below.

BRIEF DESCRIPTION OF THE DRAWINGS/FIGURES

Embodiments of the invention are described, by way of example only, with reference to the accompanying drawings, in which.

Figure 3:
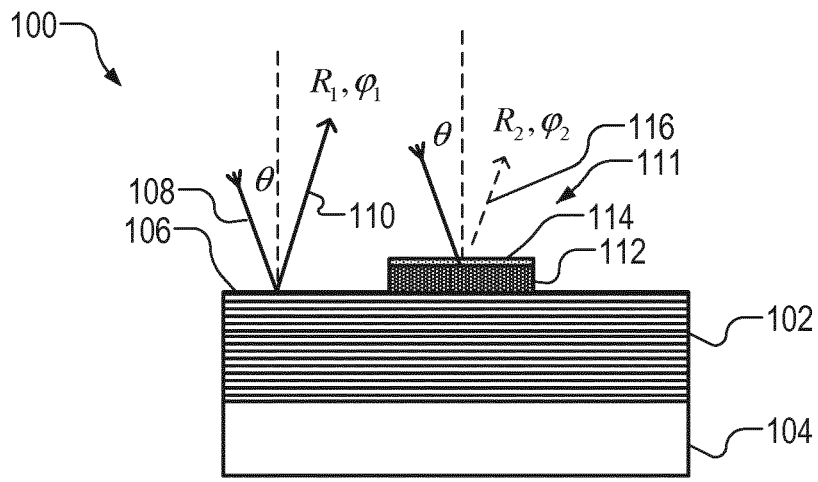
FIG. 3 illustrates the form of features on a conventional patterning device, used in the apparatus of FIGS. 1 and 2.
Figure 5:
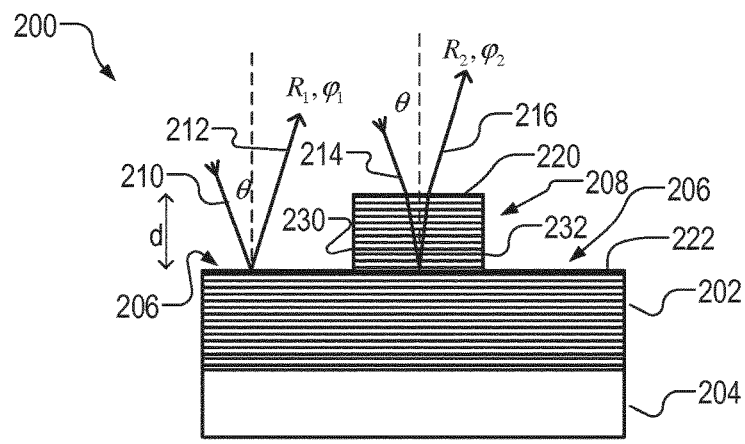
FIG. 5 illustrates the form of a patterning device in a first variant, for use in the lithographic apparatus of FIGS. 1 and 2 according to an embodiment of the present invention.
Figure 7:
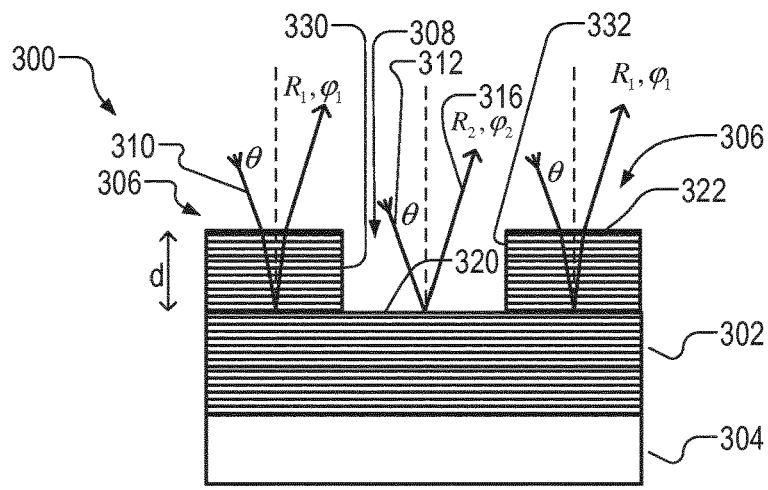
FIG. 7 shows a patterning device in a second variant, according to an embodiment of the present invention.
Figure 12:
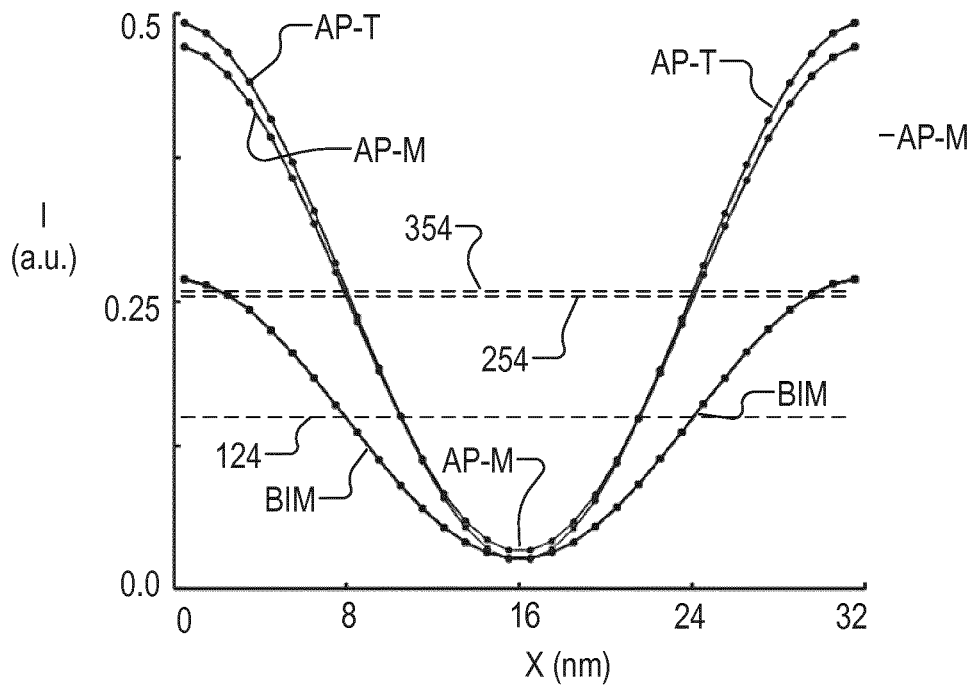
Figure 13:
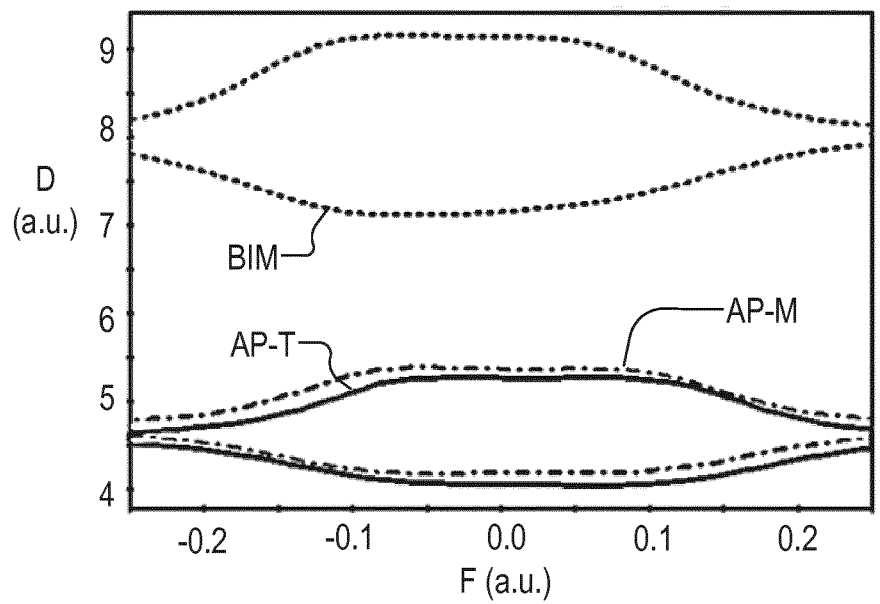
Figure 14:
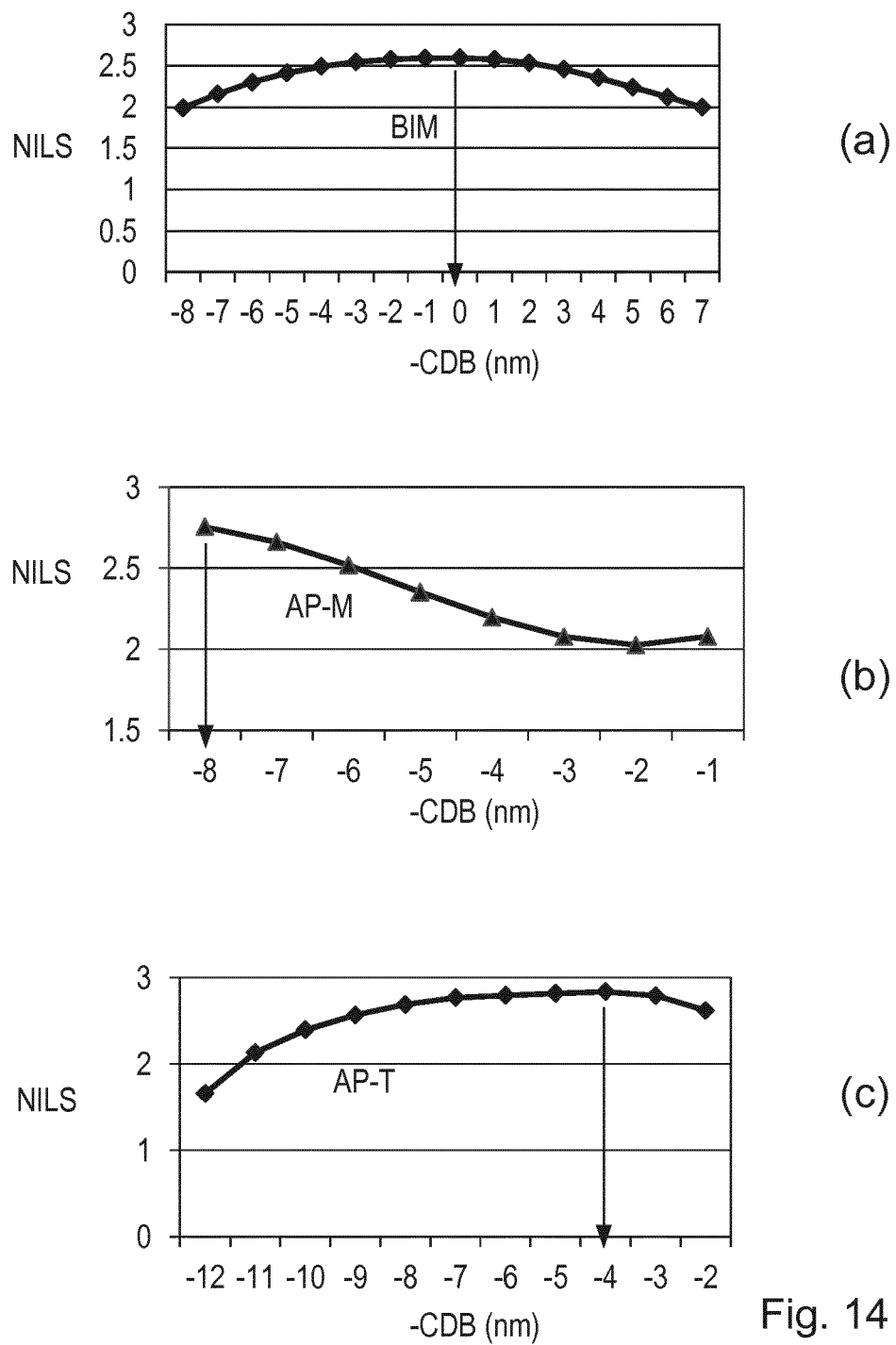
Figure 15:
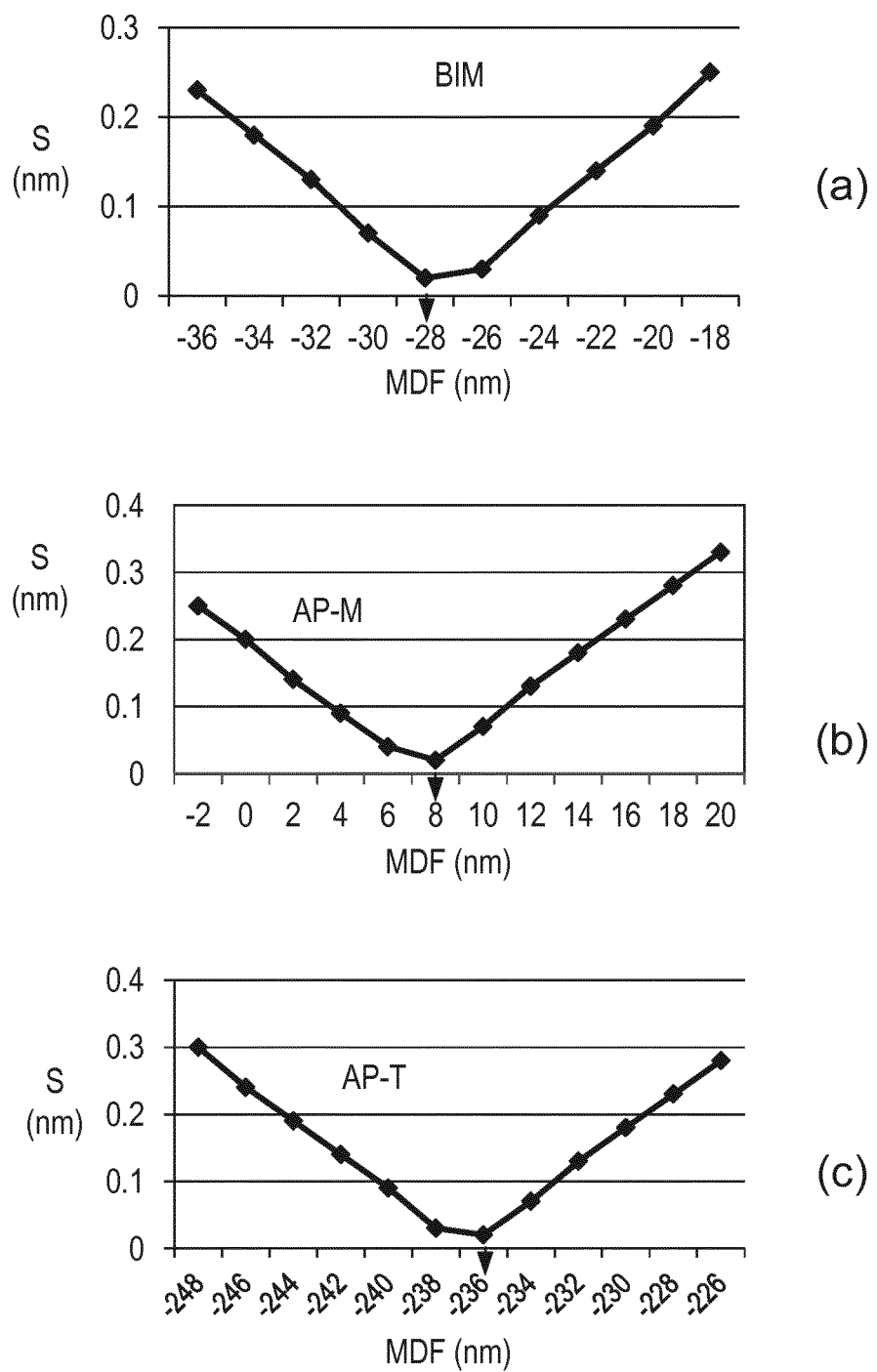
Figure 16:
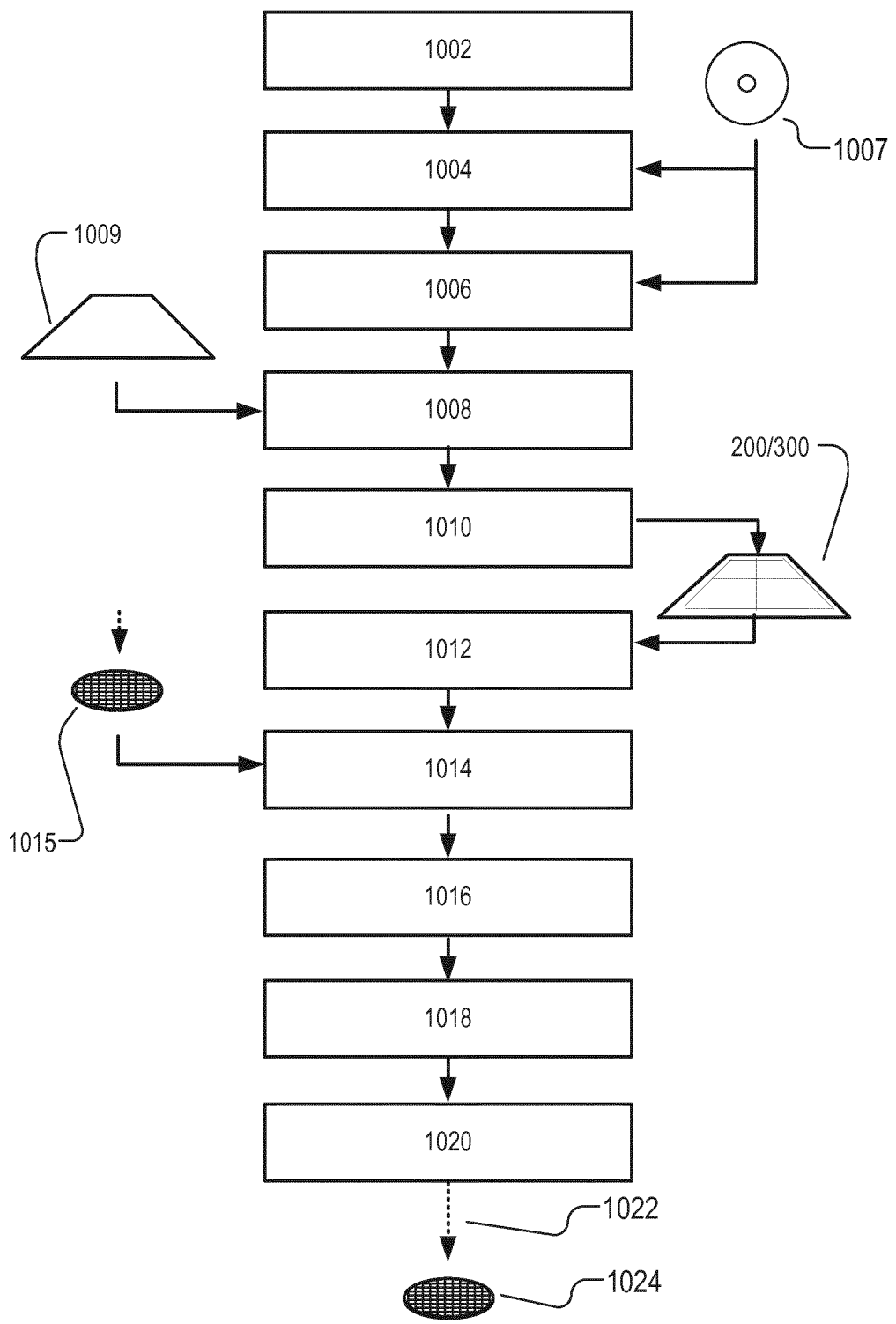

FIG. 12 compares aerial images between the patterning devices of FIGS. 3, 5 and 7;

FIG. 13 compares process windows obtainable by the patterning devices of FIGS. 3, 5 and 7;

FIG. 14 illustrates the different optimization of bias values using the patterning device types of FIGS. 3, 5 and 7;

FIG. 15 illustrates optimization of a defocus parameter in the use of patterning devices of FIGS. 3, 5 and 7; and FIG. 16 is a flow chart of steps in the designing, making and using a patterning device according to embodiments of the invention.

DETAILED DESCRIPTION OF EXEMPLARY EMBODIMENTS

Figure 1:
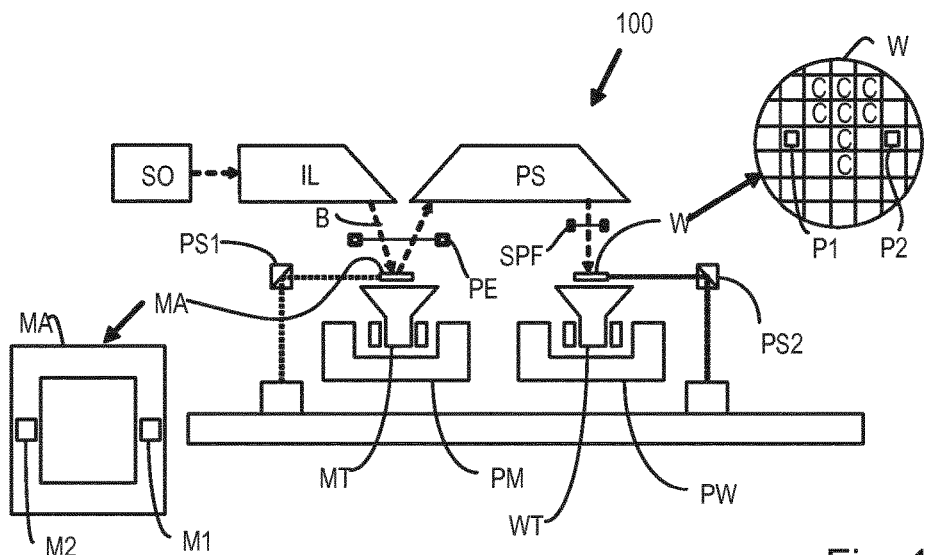
FIG. 1 depicts schematically a lithographic apparatus having reflective projection optics.

FIG. 1 schematically depicts a lithographic apparatus 100 including a source module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

An EUV membrane, for example a pellicle PE, is provided to prevent contamination of the patterning device from particles within the system. Such pellicles may be provided at the location shown and/or at other locations. A further EUV membrane SPF may be provided as a spectral purity filter, operable to filter out unwanted radiation wavelengths (for example DUV). Such unwanted wavelengths can affect the photoresist on wafer W in an undesirable manner. The SPF may also optionally help prevent contamination of the projection optics within projection system PS from particles released during outgassing (or alternatively a pellicle may be provided in place of the SPF to do this). Either of these EUV membranes may comprise any of the EUV membranes disclosed herein.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
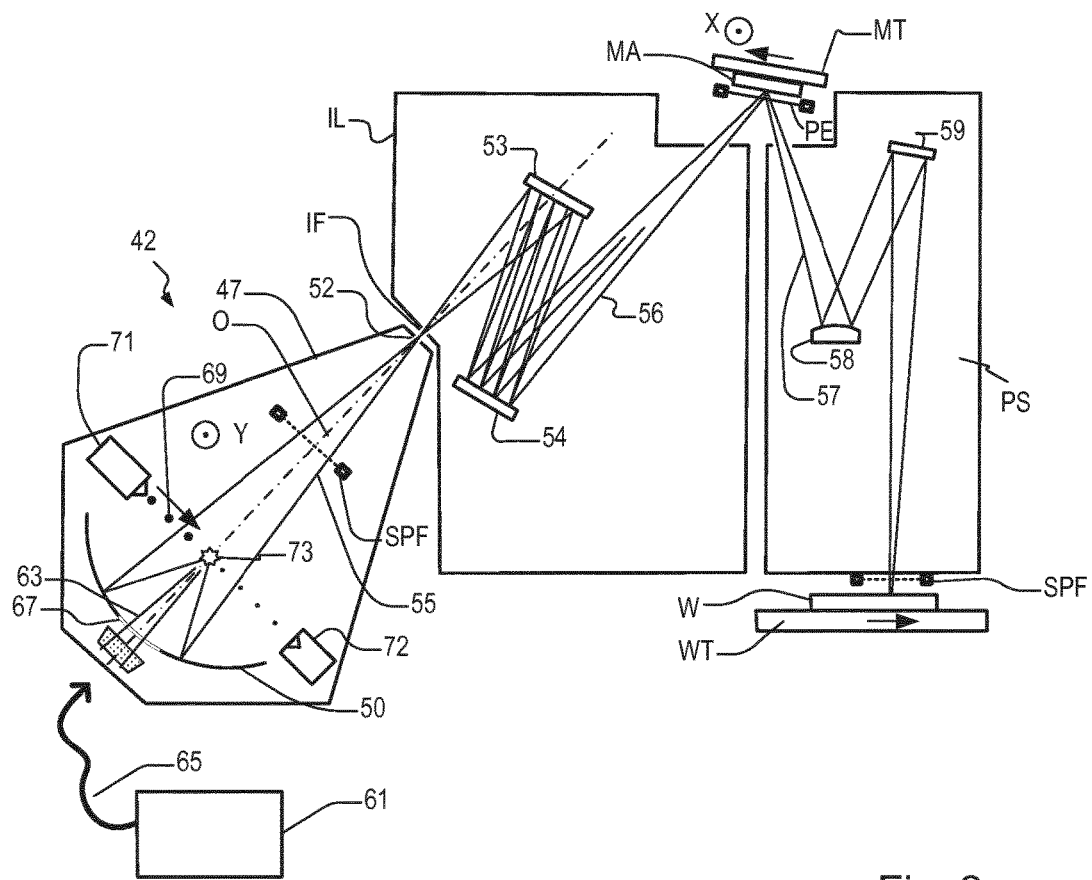
FIG. 2 is a more detailed view of the apparatus of FIG. 1.

FIG. 2 shows an embodiment of the lithographic apparatus in more detail, including a radiation system 42, the illumination system IL, and the projection system PS. The radiation system 42 as shown in FIG. 2 is of the type that uses a laser-produced plasma as a radiation source. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, optical excitation using $CO_2$ laser light. In an embodiment, Sn is used to create the plasma in order to emit the radiation in the EUV range.

The radiation system 42 embodies the function of source SO in the apparatus of FIG. 1. Radiation system 42 comprises a source chamber 47, in this embodiment not only substantially enclosing a source of EUV radiation, but also collector 50 which, in the example of FIG. 2, is a normal-incidence collector, for instance a multi-layer mirror.

As part of an LPP radiation source, a laser system 61 is constructed and arranged to provide a laser beam 63 which is delivered by a beam delivering system 65 through an aperture 67 provided in the collector 50. Also, the radiation system includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. A trap 72 is provided on the opposite side of the source chamber 47, to capture fuel that is not, for whatever reason, turned into plasma. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. These create a highly ionized plasma with electron temperatures of several $10^5$ K. The energetic radiation generated during de-excitation and recombination of these ions includes the wanted EUV which is emitted from the plasma at position 73. The plasma formation position 73 and the aperture 52 are located at first and second focal points of collector 50, respectively and the EUV radiation is focused by the normal-incidence collector mirror 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56, via pellicle PE, onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present, rather than the two elements 58 and 59 shown in FIG. 2.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source module (apparatus) 42, the X axis coincides broadly with the direction of fuel stream (69, described below), while the Y axis is orthogonal to that, pointing out of the page as indicated. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

In addition to the wanted EUV radiation, the plasma produces other wavelengths of radiation, for example in the visible, UV and DUV range. There is also IR (infrared) radiation present from the laser beam 63. The non-EUV wavelengths are not wanted in the illumination system IL and projection system PS and various measures may be deployed to block the non-EUV radiation. As schematically depicted in FIG. 2, an EUV membrane filter in the form of a spectral purity filter SPF may be applied upstream of the virtual source point IF, for IR, DUV and/or other unwanted wavelengths. In the specific example shown in FIG. 2, two spectral purity filters are depicted, one within the source chamber 47 and one at the output of the projection system PS. In a practical embodiment, only one spectral purity filter SPF may be provided, which may be in either of these locations or elsewhere between the plasma formation position 73 and wafer W.

FIG. 3 shows part of a patterning device (mask) conventionally used in the EUV lithographic apparatus of FIG. 2. The mask comprises a multilayer structure 102 formed on a substrate 104 for example a substrate of silicon. Multilayer structure 102 comprises alternating layers of material, for example Mo and Si layers. Bulk materials tend to be opaque and non-reflective for EUV radiation (other than at grazing incidence). By tuning the layer thicknesses and providing tens of layers in a stack (for example 40 layers), a sufficient reflectance can be obtained at a specific EUV wavelength, to form a mirror as element of an EUV optical system. In the mask 100, a mask pattern is defined by first and second regions. In the first regions of the mask the reflective surface 106 of the multilayer is exposed (optionally with a protective capping layer, not shown).

As will be appreciated from FIG. 3, incoming radiation 108 is incident not in a normal direction, but with an angle of incidence θ. Angle θ may be, for example, 6 or 8 degrees in a practical apparatus. In the case of off-axis illumination modes, the radiation will be incident from a range of angles either side of the nominal angle of incidence θ. Angle θ may be referred to as a chief ray angle of incidence in that case. While a simple reflection from surface 106 is illustrated, the nature of the EUV radiation is that portions of it penetrate into multilayer stack, and, by constructive interference, reflected radiation 110 has an intensity $R_1$ times the incident intensity, and a phase $\varphi_1$, relative to the incident radiation. The factor $R_1$ may be referred to as the reflectance of the structure.

In the second regions of the mask, absorber structures 111 are provided which substantially block the reflection by the multilayer structure. In the example shown, the absorber material is labelled 112, and a capping layer is labelled 114. The absorber layer may be, for example of TaN material.

To allow for the possibility that the absorber feature 112, 114 has some residual reflectance, a second reflected radiation 116 is illustrated in broken lines, with reflectance R2 and phase $\varphi_2$. In the ideal case, however, reflectance $R_2$ will be zero.

FIG. 4(a) shows the "aerial image" as a profile of radiation intensity I against horizontal distance X, formed in the vicinity of substrate W by the projection system PS of the lithographic apparatus. The term "aerial image" to signify that this intensity profile is present at a certain plane, whether or not the substrate and light-sensitive resist lies in that plane or not. In a region 106', a high intensity is present, corresponding to the regions of high reflectance $R_1$. In a second region 111', the intensity is reduced, due to the lower reflectance $R_2$ of the absorber feature 111.

FIG. 4(b) shows in cross section a product substrate 120 on which a layer of radiation sensitive resist has been provided. In a real device manufacturing process, the substrate 120 may have other layers and or structures lying beneath the resist material. Such layers include product material layers to be etched after developing the device pattern in the resist, and an anti-reflective coating (BARC). Additionally, product structures may have been made in a previous lithographic step. For simplicity in the present example, only the substrate material SUB and the resist material RST are represented. Using a positive tone development process, the aerial image shown in FIG. 4(a) causes resist material to be removed in a region 122, where the intensity of radiation is above a threshold 124. Where the aerial image intensity is below the threshold, a feature 126 remains in the developed resist. As is known, the aim of a lithographic process is to create features such as feature 126 with well-defined position and dimensions. The feature may be a pre-cursor to forming a device feature such as a conductive line, a transistor gate, or a contact hole.

Several parameters of the structure in the resist are defined for monitoring performance of the lithographic process. Critical dimension CD, also commonly referred to as linewidth, is a common performance parameter and is labelled in the diagram. Referring to FIG. 4(c), in the event that the aerial image is formed with poor contrast, the exact boundary of the resist structure 126, and consequently the CD becomes uncertain and variable. As well as the absolute value of CD coming out of specification, important performance parameters such as line edge roughness (LER) and CD uniformity may be affected. Uniformity of the critical dimension (CDU) is generally important for device performance, at least over a local area (local CDU), and possibly over the entire substrate.

To achieve good contrast in EUV lithographic processes, as in any lithographic process, is very challenging. As is well known, the intensity of EUV source radiation is lower than desired, and EUV optical elements such as multilayer mirrors, suffer from relatively low reflectance, so that much light is lost in the system before it reaches the resist layer. Particularly for tiny features (for example in the 7 or 10 nm nodes), the chemistry required to produce an effective photoresist for high volume manufacture leads to poor CDU and LER performance. Methods can be taken to enhance contrast. For example, illumination modes generated in an illumination system IL can be set to have illumination in only very localized portions at the periphery of the pupil. This can reduce the available light, as well as increasing the cost of the apparatus. The optical system as a whole can be designed with a high numerical aperture (NA), but this again adds to the cost. The intensity of the source radiation can be increased to increase the dose available at the resist. All of these measures are expensive and require significant investment and development.

As an alternative to enhance contrast and improve performance parameters such as local CD uniformity, it is proposed herein to use a patterning device (mask) without absorber features, and to rely on phase difference alone to create a desired aerial image. While the following examples will be described as lacking absorber material, it should be understood that this absence of absorber material may apply only in certain areas of the device pattern as represented in the mask. In particular, the absorberless mask structure may be used for the parts of a product layout that involve the finest features, requiring the full resolution of the EUV imaging system. In other areas, particularly where larger features are to be formed, absorber material may be present, in the manner of the existing mask shown in FIG. 3. Absorber material may also be used to define alignment features for the lithographic apparatus or for a metrology apparatus. Absorber material may also be used to provide a mask black border ring, which is typically present on a mask.

FIG. 5 illustrates a portion of a first example of an absorberless patterning device or mask 200. Again, the mask in this example is designed to operate a reflective mode, for example in EUV wavelengths. Again, a multilayer reflective structure 202 is formed on a mask substrate 204. To define a mask pattern, in first regions 206 the multilayer structure has been partially etched away, leaving second regions to form line or mesa structures 208 standing with a height difference d. In the etched region 206, radiation 210 incident at angle θ is reflected at the multilayer structure 202. Reflected radiation 212 has intensity determined by the reflectance $R_1$, and a phase φ1. In the second regions 208, incident radiation 214 is reflected at 216. The intensity of the second reflected radiation is governed by reflectance $R_2$ of the mesa structure 208. Phase of the reflected radiation 216 is $φ_2$. Unlike the example of FIG. 3, where an absorber material is included to give a low reflectance $R_2$, an aim of the present design is to reflect substantially equal intensities of radiation from all parts of the mask (at least within the absorberless area). On the other hand, the etch depth d is designed, with knowledge of the radiation wave length and incidence angle θ, so that the phases $φ_1$ and $φ_2$ are substantially 180 degrees apart. For the purpose of the present disclosure, substantial equal reflectances can be considered to exist if the lower reflectance is at least 85% of the higher reflectance. In a practical embodiment, it is expected that close to 100% equality can be achieved, for example at least 90% or at least 95%.

In addition to layers of the multilayers stacked as shown, the surface of the mask in one or both of the areas 206 and 208 they have a coating 220 (not separately shown). This may be for protective purposes to avoid degradation of the multilayer structure itself or to avoid Si or Mo outgassing into the EUV vacuum environment in the EUV apparatus. In addition, as part of the manufacturing of the etched portions, surface 222 of the etched portions may be defined by an etch stop layer (not separately shown) which is positioned in the multilayer stack when initially formed, and serves to define accurately a level at which the etching will stop and the distance is achieved. The etch stop layer may be used as a capping layer in the finished mask, or may be removed after etching.

Figure 4:
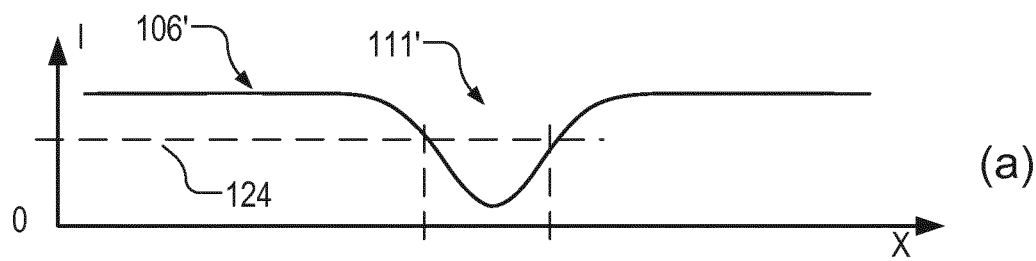
FIG. 4 illustrates (a) the formation of an aerial image, (b) a developed resist and (c) a developed resist with poor contrast, according to a known lithographic method.
Figure 4:
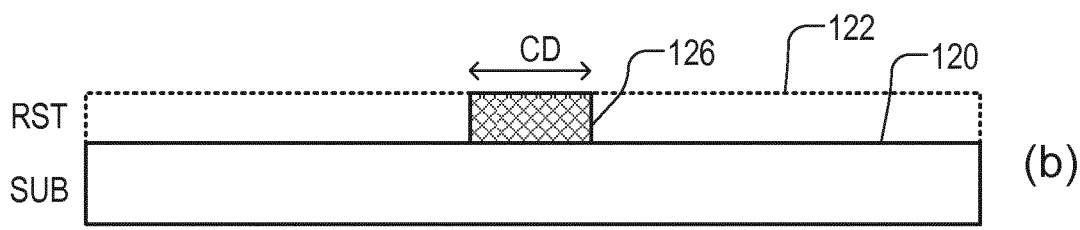
Figure 4:
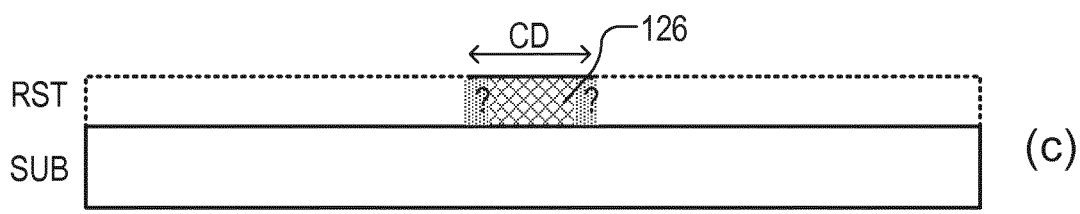
Figure 6:
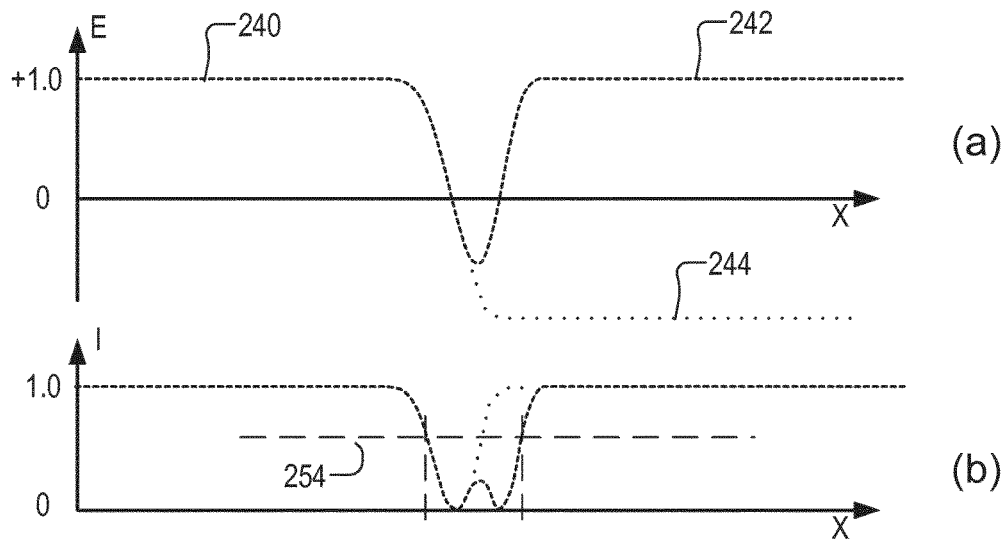
FIG. 6 illustrates (a) an electric field of the aerial image formed by a patterning device of FIG. 5 (not on the same scale), (b) an intensity of the aerial image, (c) a developed resist pattern produced by the aerial image using a positive tone process and (b) a developed resist pattern formed by the aerial image using a negative tone process.
Figure 6:
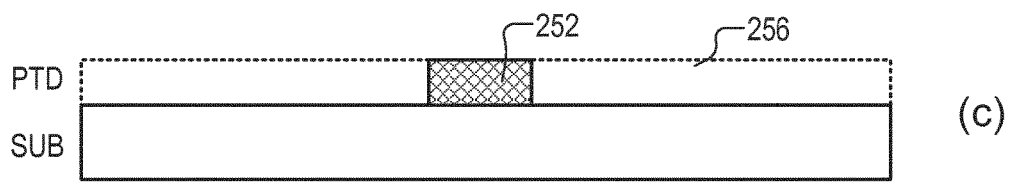
Figure 6:
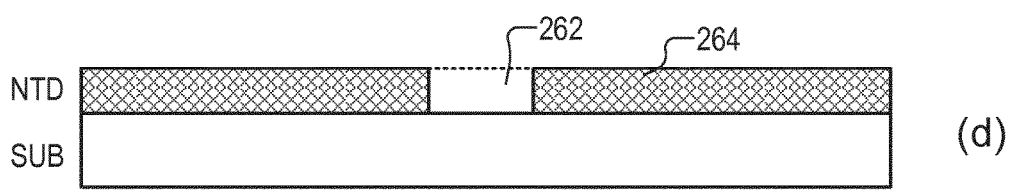

Referring now to FIG. 6, the manner in which an aerial image is formed and a pattern developed in the resist is quite different from the absorber method of FIGS. 3 and 4. As is known, resist materials respond to the intensity of radiation, and not its absolute amplitude or phase. The intensity is proportional to the square of the magnitude of the electric field ($I \sim |E|^2$). On the other hand, where different fields (say, $E_1$ and $E_2$) contribute to the field at a given point, the amplitudes and phases of fields must be added, and the combined field determines the intensity ($I \sim |E|^2 = |E_1+E_2|^2$). Therefore where different fields overlap they can interfere destructively or constructively to define an intensity profile.

FIG. 6(a) shows the amplitude of electric field E of the radiation on an arbitrary scale, when an aerial image is formed using radiation reflected by the first and second regions of the mask illustrated in FIG. 5. Notice firstly that, in an absorberless phase mask, all parts of the mask are reflective with substantially full intensity. All parts of the mask can contribute to the intensity in the aerial image, but they will interfere constructively or destructively, according to their relative phase. The features of the mask structure which cause the features of contrast in the aerial image are in fact the edges 230 and 232, where the phase of the reflected radiation undergoes an abrupt change. In the electric field, the etched portions at either side of the mesa structure 208 give rise to uniform electric field amplitude as shown at 240-242. The step or edge 230 between the etched portion and the mesa portion gives rise to a phase change in the reflected radiation, and ideally a phase change of 180 degrees (phase reversal). If it were not for the second edge 232, the electric field would follow a path from the portion 240, through zero and through a negative value (portion 244 shown in ghost form). However, in the mask design the second edge 232 is formed in proximity to the first edge, and the amplitude of the electric field switches back to the positive value seen at 242. Various properties of the optical system determine the sharpness of the phase change in the X direction, including for example the NA of the projection system, the illumination wavelength, and the illumination intensity profile.

FIG. 6(b) shows the intensity I of the aerial image, again on an arbitrary scale, corresponding to the electric field shown at (a). At the same time, the aerial image has a double trough form, being partly formed by the edge 230 and partly formed by the edge 232.

FIG. 6(c) shows the resulting structure formed in a resist with a positive tone characteristic (generally referred to in the industry as positive tone development or PTD). The developed resist remains as feature 252 where the intensity has been below the threshold 254. In regions 256 where the intensity has been above the threshold, exposed resist 256 is removed in development.

Some embodiments of the present disclosure use a negative tone process (generally referred to as negative tone development or NTD) where portions which are not exposed to radiation are removed in the development. The positive or negative tone characteristic of the process may be determined by the photochemical and chemical properties of either the resist material or the developer. The abbreviations PTD and NTD are used herein to encompass any combination of these having the effect described, whether it is achieved by a change of resist, a change of developer, and/or any change of process conditions.

FIG. 6(d) shows the result of using the aerial image of FIG. 6(b) in a NTD process. In a region corresponding roughly to the mesa structure 208, the resist 262 has been removed in the development process. The resist remains in portions 264 that were exposed to radiation above the threshold 254. Particularly for features which are confined in two dimensions, such as contact holes, NTD processes are expected to be beneficial because the absorberless phase shift mask is particularly adapted for producing well-defined dark spots within a bright field, in the aerial image. The present disclosure is not limited to the use of negative tone development resist and processes, however.

Most processes are positive tone processes (PTD), and well-known to those skilled in the art. Examples of negative tone processes in the EUV wavelength range are described in the following references, for example: (1) Toshiya Takahashi et al "Evaluations of negative tone development resist and process for EUV lithography", Proc. SPIE 9048, Extreme Ultraviolet (EUV) Lithography V, 90482C (Apr. 17, 2014); doi:10.1117/12.2046175; and (2) Changil Oh et al "Comparison of EUV patterning performance between PTD and NTD for 1× nm DRAM" Author(s): Proc. SPIE 9048, Extreme Ultraviolet (EUV) Lithography V, 904808 (17 Apr. 2014); doi: 10.1117/12.2046624.

FIG. 7 illustrates a portion of a second example of an absorberless patterning device or mask 300. Reference signs 302 etc. in the second example indicate features of similar function to the features 202 etc. of the first example of FIG. 5. Again, the mask in this example is designed to operate a reflective mode, for example in EUV wavelengths. Again, a multilayer reflective structure 302 is formed on a mask substrate 304. To define a mask pattern, in first regions 306 the multilayer structure has not been etched away but remains at full thickness. In second regions 308 the multiplayer structure has been etched to form trench or pit structures 308 with a height difference d. In the first regions 306, radiation 310 incident at angle θ is reflected at the multilayer structure 302. Reflected radiation 312 has intensity determined by the reflectance $R_1$, and a phase $\varphi 1$. In the second regions 308, incident radiation 314 is reflected at 316. The intensity of the second reflected radiation is governed by reflectance $R_2$ of the trench structure 308. The phase of the reflected radiation 316 is $\varphi_2$. As in the example of FIG. 5, is to reflect substantially equal intensities of radiation from all parts of the mask (at least within the absorberless area). The etch depth d is designed again so that the phases $\varphi_1$ and $\varphi_2$ are substantially 180 degrees apart.

In addition to layers of the multilayers stacked as shown, the surface of the mask in one or both of the regions 306 and 308 may have a sealing layer or coating 320 (not separately shown). This may be for protective purposes to avoid degradation of the multilayer structure itself. In addition, as part of the manufacturing of the etched portions, surface 322 of the etched portions may be defined by an etch stop layer (not separately shown). The etch stop layer may be used as a capping layer in the finished mask, or may be removed after etching.

Figure 8:
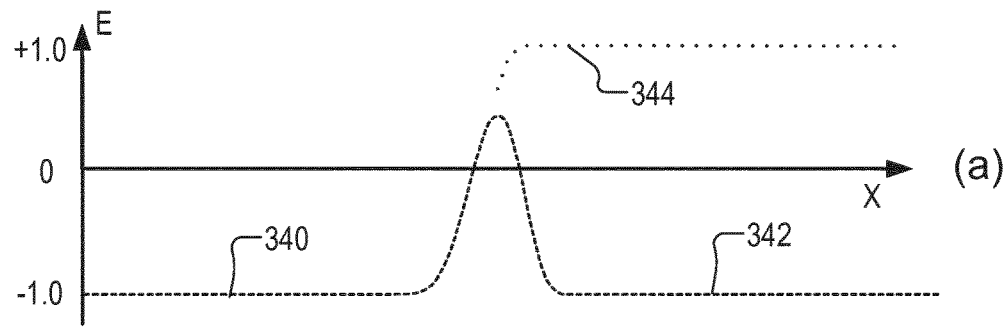
FIG. 8 illustrates (a) an electric field of the aerial image formed by a patterning device of FIG. 7 (not on the same scale), (b) an intensity of the aerial image, (c) a developed resist pattern produced by the aerial image using a positive tone process and (b) a developed resist pattern formed by the aerial image using a negative tone process.
Figure 8:
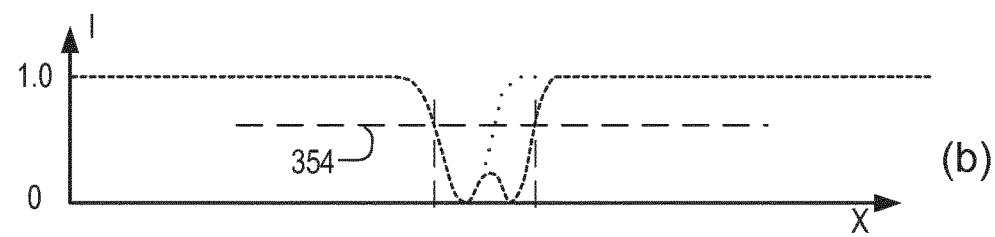
Figure 8:
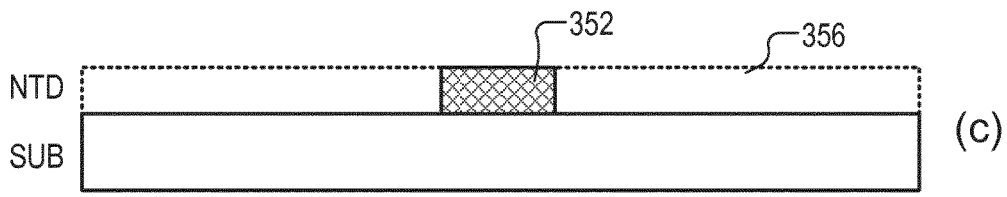
Figure 8:
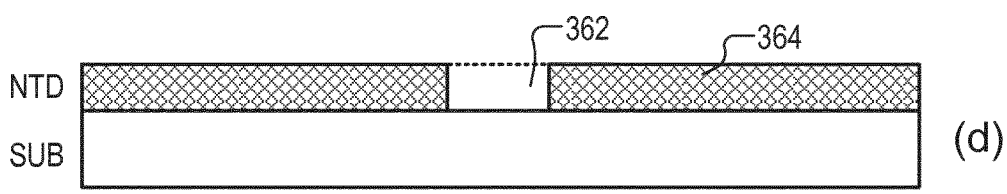

Referring now to FIG. 8, the manner in which an aerial image is formed and a pattern developed in the resist is similar to that of the example of FIG. 5. FIG. 8(a) shows the amplitude of electric field E of the radiation on an arbitrary scale, when an aerial image is formed using radiation reflected by the first and second regions of the mask illustrated in FIG. 7. The principles are similar to those described in FIG. 6, with the difference that the phases of the reflected radiation from the first regions and second regions are reversed. As in the example of FIGS. 5 and 6, the features of the mask structure which cause the features of contrast in the aerial image are in fact the edges 330 and 332, where the phase of the reflected radiation undergoes an abrupt change. In the electric field, the portions either side of the etched trench structure 308 give rise to uniform electric field amplitude as shown at 340-342. (The field is shown as having a value −1.0 for consistency with the phases of FIG. 6. The skilled reader will understand that the absolute phase is arbitrary and irrelevant.) The step or edge 330 between the etched portion and the non-etched portion gives rise to a phase change in the reflected radiation, and ideally a phase change of 180 degrees (phase reversal). As in the previous example, a second edge 332 is formed in proximity to the first edge, and the amplitude of the combined electric field switches back to the positive value seen at 342.

FIG. 8(b) shows the intensity I of the aerial image, again on an arbitrary scale, corresponding to the electric field shown at (a). Although the electric field in the trench structure of FIG. 8(a) is the inverse of that in the mesa structure of FIG. 6(a), the aerial image in intensity is essential the same in both cases. Again, the aerial image has a double trough form, being partly formed by the edge 330 and partly formed by the edge 332.

FIG. 8(c) shows the resulting structure formed in a resist with a positive tone development characteristic (PTD). The developed resist remains as feature 352 where the intensity has been below the threshold 354. In regions where the intensity has been above the threshold, exposed resist 356 is removed in development.

FIG. 8(d) shows the result of using the aerial image of FIG. 8(b) in a negative tone development (NTD) process. In a region corresponding roughly to the mesa structure 208, the resist 362 has been removed in the development process. The resist remains in portions 364 that were exposed to radiation above the threshold 354. Particularly for features which are confined in two dimensions, such as contact holes, NTD processes are expected to be beneficial, for the reason state above. The present disclosure is not limited to the use of negative tone development resist and processes, however.

While the examples of FIGS. 6 and 8 show idealized patterns in the developed resist, previous workers have found contrast to be poor in absorberless phase lithography. Consequently the technique has been largely neglected in recent years. See for example S.-I. Han et al, "Design and method of fabricating phase shift masks for extreme ultraviolet lithography by partial etching into the multilayer mirror", Proc. SPIE, Vol. 5037, p. 314, 2003. Han et al investigate absorberless phase lithography (CPL or 'chromeless phase lithography') initially, before abandoning it in favor of other mask types. Similarly, phase shift masks for EUV lithography were considered by LaFontaine et al in "Printing EUV Phase-Shift Masks using the 0.3NA Berkeley MET", presented at the 4th International EUVL Symposium—San Diego, November 2005. (Absorberless) phase shift masks are described as being of interest for focus and aberration monitoring, and for resist testing, rather than for device manufacture as such.

Figure 9:
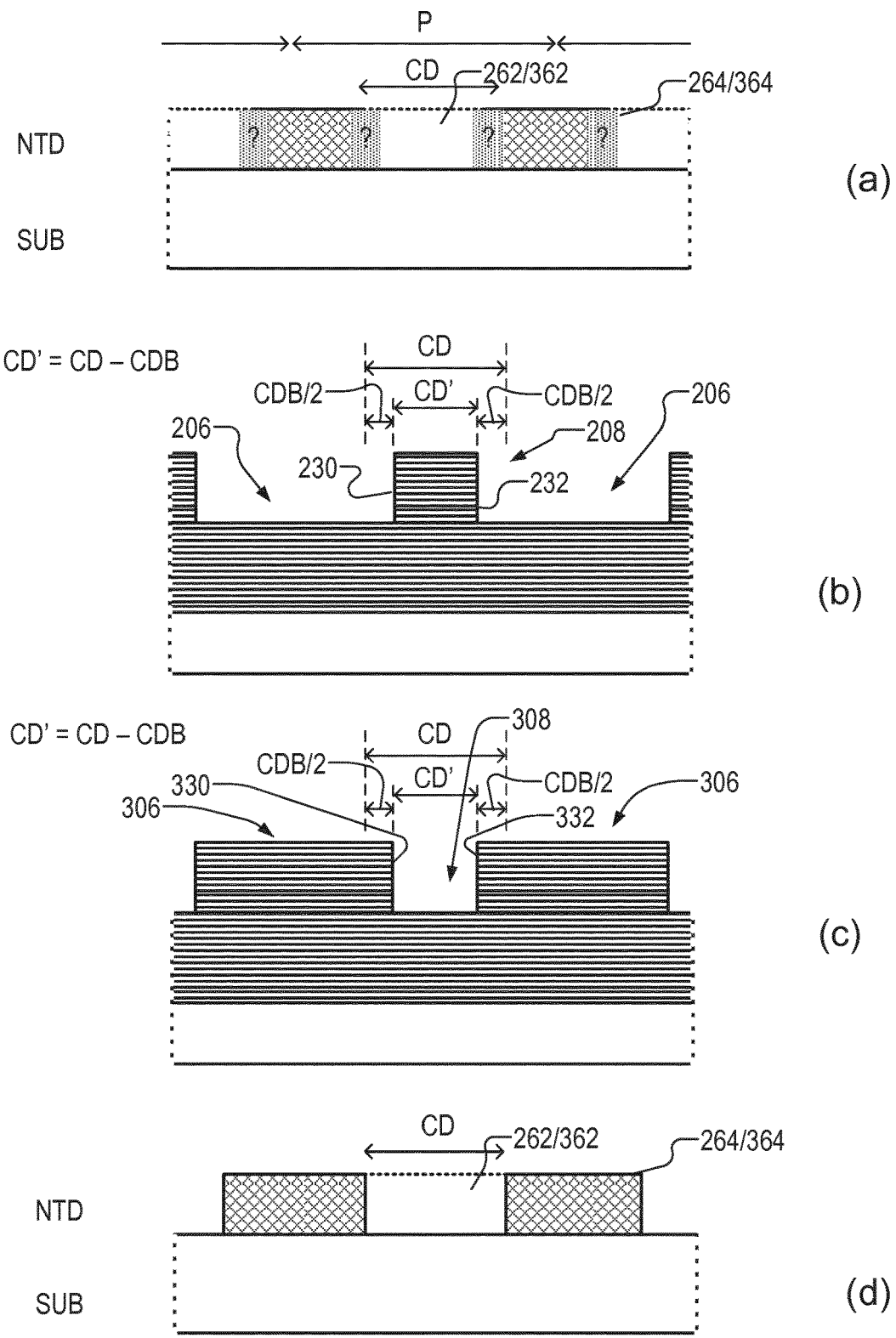
FIG. 9 shows the improvement of contrast in a negative tone process, using negative bias in the patterning device of FIG. 7.

Referring now to FIG. 9, we assume in the following examples that a dense array of features (for example lines, trenches, dots or holes) are to be made in the resist material. The array of features is periodic in the illustrated direction, with a pitch P. Roughly two pitches are shown in the drawing, it being understood that the pattern repeats to a desired distance to the left and right of what is shown. In the case of a two-dimensional array of holes or dots, the array may be periodic in a second direction (into the plane of the drawing). The pitch in the second direction may be the same as or different than the pitch P. The width of the features in the illustrated direction is the desired critical dimension or CD. Assuming a line-space ratio (more generally, mark-space ratio) of 1:1, the array may comprise for example lines or dots with CD=8 nm and pitch P=16 nm, or CD=16 nm and pitch P=32 nm. In the case of a two-dimensional pattern, the values of P and CD in the second direction, as well as the mark-space ratio, may be the same or different, according to the needs of the design. The array may be considered a dense array because the mark-space ratio is of the order of 1:1, for example between 1:2 and 2:1.

FIG. 9(a) illustrates figuratively a loss of CD and CDU performance caused by poor contrast, in the examples where features 262/264 are formed in an NTD process (the problem is illustrated already for a PTD process in FIG. 4(c)). The inventors have recognized that enhanced contrast can be obtained by applying substantial negative bias to the size of features, when designing and making absorberless phase shift masks of the type shown in FIGS. 5 and 7. Indeed contrast superior to conventional binary masks of the type shown in FIG. 3 may be expected, as explained further below.

FIG. 9(b) shows the mesa-type phase shift mask, of the type shown in FIG. 5. Dimensions CD and CD' are marked. CD represents the size of feature desired in the resist pattern. (For comparison with the mask features, the dimension of the resist feature has been scaled according to the demagnification factor of the projection system PS.) CD' represents the distance between the edges 230, 232 that are provided in the mask pattern for the purpose of forming the resist feature 262. The distance CD' is smaller than the size CD of the desired feature by a negative bias amount CDB. As illustrated, each edge is moved inward from its nominal position by an amount CDB/2. In other words, the negative bias amount CDB in the illustration is distributed equally either side of a nominal position. This is not essential, however, and an unequal distribution may be appropriate in practice, to produce the feature 362 at the exactly desired position. In particular for the case of a reflective mask such as is used in EUV lithography, an asymmetrical bias may be appropriate to correct for the non-normal incidence angle of the light. An asymmetrical bias may also be appropriate to correct for pattern-shift induced by optical aberrations (to be precise the odd-numbered Zernike aberrations).

FIG. 9(c) shows the same principle of negative bias being applied in the example of a trench-type phase shift mask of the type shown in FIG. 7. Again, the two edges 330 and 332 which are provided in the mask to define the resist feature 362 are formed at a distance CD' which is substantially small than the dimension CD of the feature 362 to be formed in the resist. The difference is the negative bias value CDB.

FIG. 9(d) shows figuratively the improvement in CD performance obtained when the substantial negative bias is applied in the design and manufacture of the absorberless phase shift mask. While the example of FIG. 9(d) illustrates the feature produced by a negative tone development (NTD) process, similar considerations can be applied in the context of a positive tone development (PTD) process, to form features 252/352 (FIG. 6(c), 8(c)). In each case, a negative bias on the feature size will be appropriate.

In quantitative terms, the negative bias value can be expressed as a percentage, or in absolute terms. It can be expressed in terms of the reduction in distance between the edges (CDB in the drawing), or in the movement of each edge (CDB/2). In one form of expression, we can say that the negative bias reduces the distance between the edges 230/330 and 232/332 by a percentage relative to the nominal size CD that the desired feature 'should' have on the mask. Thus, for example, if CD=16 nm and CD'=8 nm then the negative bias CDB is 8 nm or 50%. Similarly for CD=16 nm and CD'=12 nm then the negative bias CDB is 4 nm or 25%. In lithography conventionally, it is known to apply some bias in the dimensions of features on the mask, but typical values would be less than 15%, usually less than 10%.

In terms of theoretical basis, for coherent illumination, the aerial image intensity I is given by:

$$\vec{E}(x,y) = F^{-}[P(f_x, f_y) F(m(x,y))]$$

$$I(x,y) = \vec{E}(x,y) \cdot \vec{E}^*(x,y)$$

where $\vec{E}$ is an electric field vector, F represents a Fourier transform, F⁻ represents an inverse Fourier transform, m(x, y) represents the mask transmission function of the two-dimensional layout pattern on the mask, P(x,y) is a pupil function of the illumination system and $f_x$ and $f_y$ are spatial frequencies in directions X and Y. Mask transmission (or reflection in the case of EUV masks) affects the primary diffraction orders that in turn determine the actual aerial image intensity.

Taking as a simple example an absorberless phase shift mask comprising a set of line features (mesas or trenches) of width w arrayed in a 1-dimensional grating structure with a pitch P, the zero order amplitude will be $$E^0 = \left(1 - \frac{2w}{P}\right)$$

and the amplitude of the first order will be $$E^1 = \frac{2}{\pi}\sin\left(\frac{\pi w}{P}\right).$$

These formulae reveal properties very different to those of conventional masks. In particular, if we suppose that a grating structure is to be formed in the resist with a line-space ratio of 1:1 is desired, then we might assume that the line-space ratio of features on the mask should be 1:1 as well. This however results in w=P/2, and the zero intensity $I^0$ in the aerial image by the above formula would be zero. The inventors have recognized that the aerial image contrast depends on a good contribution from the zero order, not only the first order radiation. The introduction of negative bias (shrinking w in effect) achieves this contribution, to yield improved contrast in the image, and improved performance in the formation of features in the resist. In particular, the inventors have recognized that enhancing the zero order contribution by applying a high negative bias actually allows better image quality of the dark region by enhanced aerial image contrast to be achieved in the aerial image.

Figure 10:
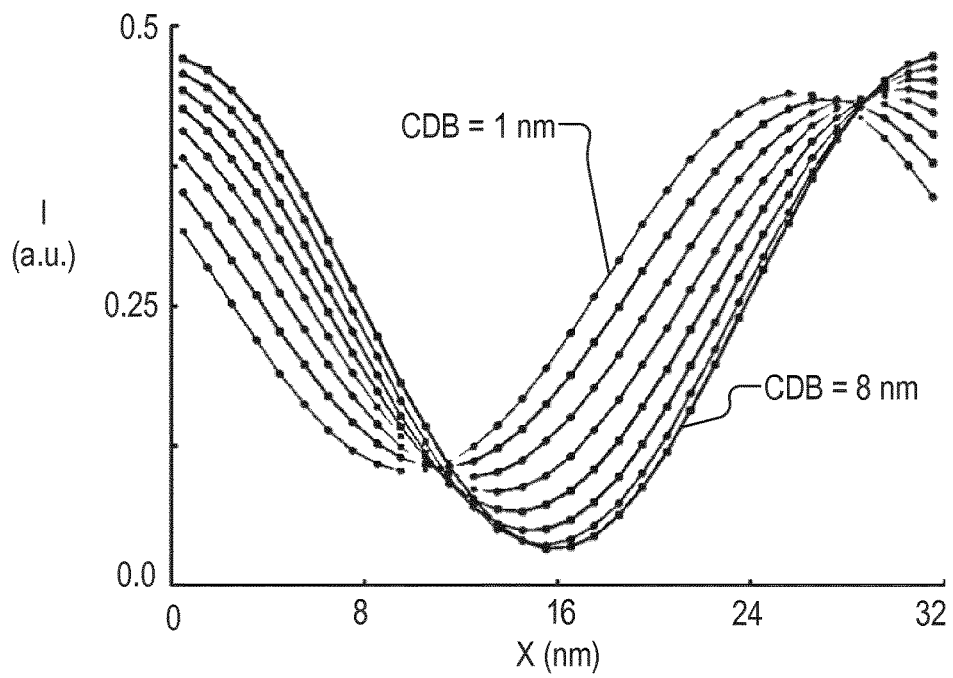
FIG. 10 is a graph showing improvement of contrast in the aerial image of a patterning device with different negative bias values.

FIG. 10 illustrates the effect of large negative bias on the aerial image, calculated for an example absorberless phase shift mask. The calculation in this example is for a feature of the mesa type shown in FIG. 5. At least at first order, a similar result would be expected for a trench type of features (FIG. 7). For the purpose of the calculation, it is assumed that a multilayer structure (202/302) is formed and etched to a depth of 113 nm, representing 16 layer pairs with a layer pair height of about 7.1 nm. For a radiation wavelength of 13.5 nm and an incidence angle θ of 6°, this depth represents 180° phase shift relative to radiation reflected by un-etched portions. 24 pairs of layers remain in the etched portions. A line structure of 16 nm is to be formed, with the intensity profile shown on an arbitrary scale. Referring again to FIG. 9, the line structure may for example be part of an array of lines with pitch 32 nm and 1:1 line-space ratio (more generally, mark-space ratio). Eight profiles are calculated and shown, with negative bias values running from 1 nm (about 6%) to 8 nm (50%). As can be clearly seen, the difference between maximum and minimum intensity (a metric of contrast) increases with increasing negative bias, so that the profile with 8 nm negative bias is the one with best contrast.

It may also be noticed that a lateral shift of the aerial image occurs as bias changes. This is because of the increasing influence of zero-order light combined with the non-zero angle of incidence. A correction to this lateral shift is easily designed into the mask making process.

Figure 11:
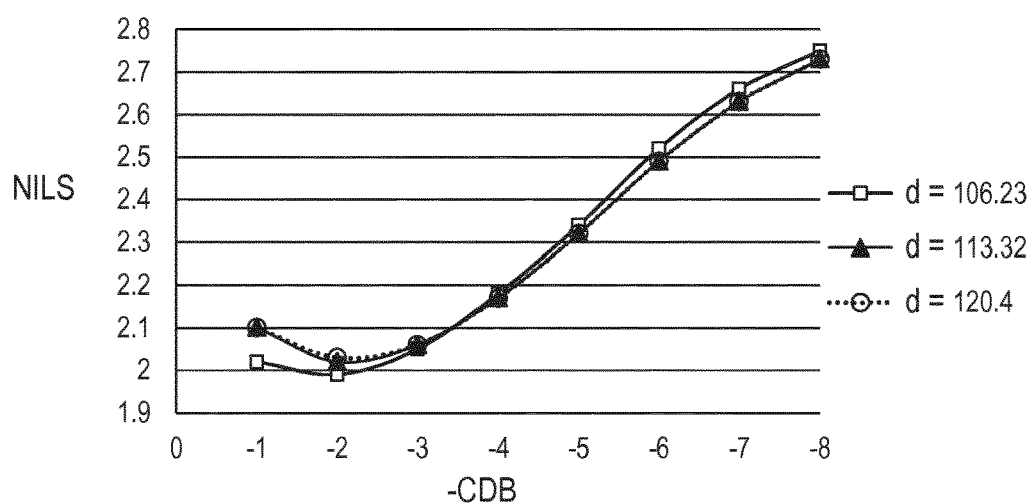
FIG. 11 illustrates a relationship between contrast and bias for a number of different etch depth values.

FIG. 11 confirms the contrast enhancement obtained with large negative bias, and further shows the influence of etch depth on the performance of the mask. Controlling etch depth is not necessarily easy, and performance of the mask would be degraded if contrast were sensitive to variations in etch depth. Contrast is measured on the vertical axis by NILS (normalized image log slope), which is a commonly used measure for comparing aerial image quality. NILS is significant because the steepness of edges in the aerial image determines the sharpness and consistency with which an edge can be placed in the developed resist. The graph confirms that, after initially falling with negative bias of 1 or 2 nm, NILS then rises with negative bias, up to a maximum at 8 nm (50%). Moreover, three traces are shown, based on calculations with different depth values d (in this example 106.23 nm, 113.32 nm and 120.4 nm). As can be seen, the contrast enhancement is consistent for all three depth values, and contrast in the aerial image is quite insensitive to etch depth.

FIG. 12 compares the enhanced aerial images for absorberless phase shift masks of the mesa type (AP-M) and the trench type (AP-T), when an optimum negative bias is applied. Also shown on the same scale is the aerial image of a conventional binary mask (BIM), such as mask 100 shown in FIG. 3. The increased brightness (roughly doubling) of the aerial image is apparent, which is due to the contribution of photons from all parts of the mask, in the absence of absorber. The increased contrast is also apparent, as the dark parts of the aerial image are as dark as in the BIM image. The appropriate thresholds for resist sensitivity are labeled 124, 254, 354, for comparison with the schematic illustrations of in FIGS. 4, 6 and 8.

FIG. 13 shows the benefits that may be realized using the absorberless phase shift masks. Process windows are plotted, representing the combinations of dose D and focus F for which a pattern will be satisfactorily printed in a given resist process. Again, the graph compares the results of using absorberless phase shift masks of mesa type (AP-M) and trench type (AP-T), with the conventional binary mask (BIM). Focus latitude is comparable in all traces. Notably, however, the dose required in the phase shift masks is roughly half that required in the conventional mask. When the lack of source power is a major obstacle to improving throughput in current EUV lithographic apparatus, the ability to print a satisfactory pattern with half the dose of radiation translates immediately into a valuable increase in throughput.

The comparisons illustrated in FIGS. 12 and 13 are made using a same illumination mode, in the form of a moderate dipole. Co-optimization of the exact shape of the illumination mode and the two-dimensional shapes to be patterned may be of additional value at smaller features sizes and pitches. Reduced reliance on extreme illumination modes can make better use of the source radiation.

The optimum parameters of a mask design depend on the device pattern to be produced, and a design process can be performed to optimize parameters such as negative bias. It can also be determined as a preliminary step, which areas within an overall device pattern should be made using absorberless phase lithography, and which areas are better made with absorbers. Without using absorbers, a layout preprocessing step can be performed in which broad dark area is transformed into a dense array with dummy features or assist features that lend themselves for absorberless phase lithography. The design process can be performed primarily by numerical simulation, with confirmation by experiment when required.

FIG. 14 illustrates results of numerical simulations to determine optimum bias values for (a) a conventional binary mask, and absorberless phase shift masks (b) of mesa type (AP-M) and (c) of trench type (AP-T). As already mentioned, optimization of bias in conventional mask types, but generally the selected bias value will be close to zero, say within 10% of nominal CD. In the absorberless masks (b) and (c), the simulations reveal much greater negative bias as the optimum values, namely around 8 nm (50% in this example) for the mesa type and 4 nm (around 25%) for the trench type. NILS is used as a performance measure for optimization of bias in this case. Other measures can be used if desired.

Referring to FIG. 15, a second phase of design optimization can be implemented, to determine an optimum focus/defocus setting for the new mask in the lithographic apparatus. It is found that the phase shift mask with different negative bias values results in slight lateral shifts of the printed pattern (this effect can be seen in FIG. 10, for example). These shifts can be corrected to bring the center of a line or other feature to a desired position in X and Y on the substrate W. FIG. 15 illustrates simulations to search for optimum mask side defocus (MDF) in the case of (a) a conventional binary mask, and absorberless phase shift masks (b) of mesa type (AP-M) and (c) of trench type (AP-T). In each graph, the vertical axis represents a shift S of the pattern for different values of defocus. The shifts observed (calculated) are all small fractions of a nanometer, but too large to ignore in the context of the overlay 'budget' for high performance lithography. Each graph shows how an optimum value of mask-side defocus can be found, for which the shift S is close to zero.

FIG. 16 illustrates methods of designing, making and using a patterning device such as reflective phase shift mask 200 or 300 of the type illustrated and described above. The mask will typically be just one of a whole set of masks relating to different layers and process steps in the formation of a complete product such as a semiconductor device. The mask may be of the reflective multilayer type for use in EUV lithography, while other masks in the set may be for use in other, more conventional lithography apparatus. The mask may be of a type for use in more conventional (DUV) lithography, as the principles described herein are not limited to EUV lithography. For DUV lithography, the mask may be of a reflective or transmissive type.

At 1002 design information is received that defines a desired device pattern to be formed in the resist layer of a substrate undergoing lithographic processing. At 1004 a radiation pattern (aerial image) is defined which (for a given resist material and development process) will achieve printing of the desired device pattern. This calculation takes into account characteristics of the resist, including for example the threshold level 254/354, and whether the process is PTD or NTD type.

At 1006 a mask design is calculated which (in a given lithographic apparatus and exposure process) will best produce the calculated radiation pattern at the substrate. This calculation can be implemented by updating software in computer systems already used for mask design, for example source-mask optimization (SMO) systems that are commercially available. The present disclosure includes a computer program product 1007 comprising adapted for causing a processor to perform the calculations of steps 1004 and/or 1006 to optimize the design of an absorberless phase shift mask.

Within the calculation 1006, decisions are made to optimize parameters of the mask, including which areas of the pattern are to be made in absorberless form, and whether to use mesa structures or trench structures to form the particular mask shapes. In relation to the absorberless area or areas, bias values and defocus values are optimized, for example using the principles illustrated in FIGS. 14 and 15. To perform this optimization, any suitable algorithm can be used. In one implementation, a candidate design is defined. A cost function is defined based on simulation of the aerial image and parameters of the design are varied to minimize the cost function. The cost function may be defined for example in terms of a contrast measure, for example NILS. Other parameters of the aerial image may also be used, however, instead of or in addition to the contrast measure. A bias value may be defined as a parameter to be varied in performing the optimization. In effect, the distances between adjacent edges of features in the mask design are varied by varying the bias value. It is immaterial for a given design, whether the distance between the edges is expressed directly or by a bias percentage. In a design with two-dimensional features, the bias value or distance can be varied together or independently for the two directions. As also mentioned above, the edges of the pair could be moved by different amounts. It is a matter of detailed implementation, how these parameters are expressed in the model. In principle, properties of the resist material and processing can be varied to optimize the performance of the entire lithographic process.

If mesa type and trench type features were to be used on the same mask, different optimizations could be performed for each. In principle, such a 'mixed mode' pattern is not expected to be beneficial, and would bring complications.

At 1008 a prepared mask blank 1009 (for example with multilayer structure and buried etch stop layer) is loaded into an etching apparatus and etched or otherwise given first and second regions according to the calculated mask design. At 1010 coatings are removed and/or added as necessary to prepare the mask ready for use in lithographic apparatus. For example a protective coating may be applied across all regions, as mentioned above.

At 1012 the mask is loaded into a lithographic apparatus, such as the apparatus of FIGS. 1 and 2. At 1014 a substrate 1015 is loaded into the apparatus with a suitable coating of resist material already applied. Prior to loading, the same substrate may already have undergone several steps of lithographic processing. These include steps to make layers of device features beneath a current layer, and/or steps to prepare for making the current layer. For example, a layer of product material may be provided under the present resist, to be etched into functional device features directly after the present resist has been developed. Alternatively, a layer of hard mask material may be provided under the present resist, to be etched with the developed device pattern and then used as a mask for subsequent processing. The term 'device pattern' should be understood as including a pattern applied to a layer as a precursor to forming a functional device feature, and not only a feature that will itself be functional in the finished device.

At 1016 the substrate is exposed to the aerial image of the mask pattern, to transfer the desired device pattern into the resist. At 1018 the resist is developed (by PTD or NTD process) to remove unwanted parts of resist and leave resist material in desired device pattern. At 1020 etching and other process steps are performed to produce functional devices features in accordance with the transferred pattern. After subsequent processing steps 1022 (including potentially further lithographic steps to form further device layers), finished devices are produced at 1024.

Conclusion

From the above description and drawings, the skilled reader will appreciate several benefits may be enabled through use of the principles and examples disclosed. Higher image contrast can be obtained than by current processes, with particular benefit in the printing of the smallest features such as contact holes and cut or block masks. The higher contrast can lead to lower dose requirements, improving throughput. The higher contrast aids the suppression of stochastic noise, allowing better performance in parameters such as local CD uniformity. The technique is not limited to contact holes or other 2-D confined structures. The examples above illustrate use for line/space arrays also.

The higher contrast can lead to lower dose requirements, improving throughput. Multiple exposure steps currently performed by ArF lithography may be replaced by a single EUV exposure. The mask blanks for absorberless phase shift lithography can be cheaper if no absorber material needs to be deposited. (This benefit will not accrue if absorber material is required in other areas of the mask, however.)

The invention may further be described using the following clauses:

1. A patterning device carrying a pattern of features to be transferred onto a target portion of a substrate using a lithographic apparatus and a negative tone process, at least an area of the patterning device being free of light absorber material and configured to define features of the pattern in that area by phase differences alone.
2. The patterning device according to clause 1, wherein an individual feature in the said area is defined at least in one direction by a pair of edges between regions of different phase, and wherein a distance between the pair of edges is at least 15% smaller than a size of the feature to be formed on the substrate in said negative tone process.
3. The patterning device according to clause 2, wherein the distance between the pair of edges is at least 30% smaller than the size of the feature to be formed on the substrate.
4. The patterning device according to clause 1, 2 or 3 wherein the individual feature in the said area is defined at least in one direction by a pair of edges between regions of different phase, the pair of edges being formed by etching a trench or pit feature into a multilayer reflective structure formed on a patterning device substrate.
5. The patterning device according to clause 1, 2, 3 or 4 wherein the individual feature in the said area is defined by a pair of edges between regions of different phase, the pair of edges being formed by etching into a multilayer reflective structure formed on a patterning device substrate so as to leave a mesa feature.
6. The patterning device according to any preceding clause, the patterning device comprising a multilayer reflective structure formed on a patterning device substrate, wherein features of the pattern are defined by etching the multilayer reflective structure in selected regions so as to impart substantially opposite phases to reflected radiation from etched and non-etched regions, taking into account a wavelength and angle of incidence to be used in said lithographic apparatus.
7. The patterning device according to clause 6, wherein reflectance in the etched regions is greater than 85% of that in non-etched regions.
8. The patterning device according to any preceding clause, configured for transferring said pattern using radiation having a wavelength between 5 and 15 nanometers.
9. The patterning device according to clause 6, wherein a protection layer or sealing layer of high transparency for the exposing wavelength is provided over the entire multilayer reflective structure in said area.
10. A method of manufacturing devices wherein a device pattern is applied to a series of substrates using a lithographic apparatus and using a lithographic process, the method including using the patterning device according to any of the clauses 1 to 9 to apply the device pattern onto a resist material, and developing the applied pattern and processing the substrate in accordance with the developed pattern, wherein the pattern is formed in the resist by a negative tone process.
11. A method according to clause 10 wherein the device pattern is applied to the resist using radiation of a wavelength in the range 5 to 15 nm.
12. A method of manufacturing a patterning device for use with a lithographic apparatus, the method comprising:
    defining a desired device pattern comprising a plurality of features to be formed in a layer of resist material in an area within a target portion of a substrate;
    calculating a radiation pattern for realizing the device pattern of said area in a negative tone process;
    calculating a patterning device design for realizing the calculated radiation pattern by phase differences alone, given a predetermined wavelength and incidence angle; and
    manufacturing the patterning device according to the calculated patterning device design, the patterning device being free of absorber material in an area corresponding to said area.
13. A method according to clause 12, wherein a distance between a pair of edges in at least one direction in the calculated patterning device design is at least 15% smaller than a size of a corresponding feature in the desired device pattern.
14. A method according to clause 12 or 13 wherein the patterning device design is realized by etching into a multilayer reflective structure formed on a patterning device substrate.
15. A method according to clause 14, wherein an etch depth is determined to achieve substantially a phase reversal, when reflecting radiation of the predetermined wavelength and incidence angle.
16. A method according to clause 12, 13, 14 or 15 wherein the predetermined wavelength lies in the range 5 to 15 nm.
17. A method according to clause 12, 13, 14, 15 or 16 wherein calculating the patterning device design includes varying one or more parameters of the design to optimize a contrast measure in the simulated aerial image.
18. A method as according to clause 17 wherein a distance between a pair of edges in one direction is varied as a parameter of the patterning device design.
19. A method according to any of clauses 12 to 18 wherein a calculating the patterning device design includes co-optimization between an illumination shape to be used in the lithographic apparatus and the features on the patterning device.
20. A patterning device carrying a pattern of features to be transferred onto a target portion of a substrate using a lithographic apparatus, at least an area of the patterning device being free of light absorber material, wherein the pattern of features in the said area comprises a dense array of individual features of which the individual features are defined in at least one direction by pairs of edges between regions of different phase.

21. The patterning device according to clause 20, wherein a distance between the pair of edges in the said one direction is at least 15% smaller than a size of the individual feature to be formed on the substrate.

22. The patterning device according to clause 21, wherein the distance between the pair of edges is at least 30% smaller than the size of the individual feature to be formed on the substrate.

23. The patterning device according to clause 20, 21 or 22 wherein each individual feature in the said area is defined by a pair of edges between regions of different phase, the pair of edges being formed by etching a trench or pit feature into a multilayer reflective structure formed on a patterning device substrate.

24. The patterning device according to clause 20, 21, 22 or 23 wherein each individual feature in the said area is defined by a pair of edges between regions of different phase, the pair of edges being formed by etching into a multilayer reflective structure formed on a patterning device substrate so as to leave a mesa feature.

25. The patterning device according to any of clauses 20 to 24, the patterning device comprising a multilayer reflective structure formed on a patterning device substrate, wherein features of the pattern are defined by etching the multilayer reflective structure in selected regions so as to impart substantially opposite phases to reflected radiation from etched and non-etched regions, taking into account a wavelength and angle of incidence to be used in said lithographic apparatus.

26. The patterning device according to clause 25, wherein reflectance in the etched regions is greater than 85% of that in non-etched regions.

27. The patterning device according to any of clauses 20 to 26, configured for transferring said pattern using radiation having a wavelength between 5 and 15 nanometers.

28. The patterning device according to clause 27, wherein a protection layer or sealing layer of high transparency for the exposing wavelength is provided over the entire multilayer reflective structure in said area.

29. A method of manufacturing a patterning device for use with a lithographic apparatus, the method comprising:
defining a desired device pattern comprising a dense array of features to be formed in a layer of resist material in an area within a target portion of a substrate;
calculating a radiation pattern for realizing the device pattern of said area in the resist material;
calculating a patterning device design for realizing the calculated radiation pattern by phase differences alone, given a predetermined wavelength and incidence angle; and
manufacturing the patterning device according to the calculated patterning device design, the patterning device being free of absorber material in an area corresponding to said area.

30. A method according to clause 29, wherein in at least one direction a spacing between a pair of edges in the calculated patterning device design is at least 15% smaller than a size of a corresponding feature in the desired device pattern.

31. A method according to clause 29 or 30 wherein the patterning device design is realized by etching into a multilayer reflective structure formed on a patterning device substrate.

32. A method according to clause 31, wherein an etch depth is determined to achieve substantially a phase reversal, when reflecting radiation of the predetermined wavelength and incidence angle.

33. A method according to clause 29, 30, 31 or 32 wherein the predetermined wavelength lies in the range 5 to 15 nm.

34. A method according to any of clauses 29 to 33 wherein calculating the patterning device design includes varying one or more parameters of the design to optimize a contrast measure in the simulated aerial image.

35. A method as according to clause 34 wherein a distance between a pair of edges in one direction is varied as a parameter of the patterning device design.

36. A method according to any of clauses 29 to 35 wherein calculating the patterning device design includes co-optimization between an illumination shape to be used in the lithographic apparatus and the features on the patterning device.

35. A method according to any of clauses 29 to 36 wherein a calculating the patterning device is based on realizing the device pattern by a negative tone process.

36. A method of manufacturing devices wherein a device pattern is applied to a series of substrates using a lithographic apparatus and using a lithographic process, the method including using the patterning device according to any of clauses 20 to 28 to apply the device pattern onto a resist material, developing the applied pattern and processing the substrate in accordance with the developed pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A patterning device carrying a pattern of features to be transferred onto a target portion of a substrate using a lithographic apparatus and a resist process, at least an area of the patterning device being free of radiation absorber material and configured to define features of the pattern in that area by phase differences alone, wherein an individual feature in the area is defined at least in one direction by a pair of edges between regions having a phase different than that between the edges, and wherein a distance between the pair of edges is at least 15% smaller than a size of an associated feature to be formed on the substrate in the resist process once adjusted by a magnification factor, if any, of the lithographic apparatus.

2. The patterning device according to claim 1, wherein the distance between the pair of edges is at least 30% smaller than the size of the feature to be formed on the substrate once adjusted by a magnification factor, if any, of the lithographic apparatus.

3. The patterning device according to claim 1, wherein the individual feature in the area is defined at least in one direction by a pair of edges between regions having a phase different than that between the edges, the pair of edges formed by etching of a trench or pit feature into a multilayer reflective structure formed on a patterning device substrate, or wherein the individual feature in the area is defined by a pair of edges between regions having a phase different than that between the edges, the pair of edges formed by etching into a multilayer reflective structure formed on a patterning device substrate so as to leave a mesa feature.

4. The patterning device according to claim 1, comprising a multilayer reflective structure formed on a patterning device substrate, wherein features of the pattern are defined by etching of the multilayer reflective structure in selected regions so as to impart substantially opposite phases to reflected radiation from etched and non-etched regions, taking into account a wavelength and angle of incidence to be used in the lithographic apparatus.

5. The patterning device according to claim 4, wherein reflectance in the etched regions is greater than 85% of that in non-etched regions.

6. The patterning device according to claim 1, configured to transfer the pattern using radiation having a wavelength selected from between 5 and 15 nanometers.

7. The patterning device according to claim 4, wherein a protection layer or sealing layer of high transparency for the exposing wavelength is provided over the entire multilayer reflective structure in the area.

8. A method of manufacturing devices, wherein a device pattern is applied to a series of substrates using a lithographic apparatus and using a lithographic process, the method including using the patterning device according to claim 1 to apply the device pattern onto a resist material, and developing the applied pattern and processing the substrate in accordance with the developed pattern, wherein the pattern is formed in the resist by a negative tone process.

9. The method according to claim 8, wherein the device pattern is applied to the resist using radiation of a wavelength selected from the range 5 to 15 nm.

10. A method of defining a patterning device for use with a lithographic apparatus, the method comprising:
defining a desired device pattern comprising a plurality of features to be formed in a layer of resist material in an area within a target portion of a substrate;
calculating a radiation pattern for realizing the device pattern of the area in a resist process;
defining the patterning device by calculating a patterning device design for realizing the calculated radiation pattern by phase differences alone, given a predetermined wavelength and incidence angle, wherein a distance between a pair of edges in at least one direction in the calculated patterning device design is at least 15% smaller than a size of a corresponding feature in the desired device pattern once adjusted by a magnification factor, if any, of the lithographic apparatus.

11. The method according to claim 10, wherein the patterning device design is configured to be etched into a multilayer reflective structure formed on a patterning device substrate.

12. The method according to claim 11, wherein an etch depth is determined to achieve substantially a phase reversal, when reflecting radiation of the predetermined wavelength and incidence angle.

13. The method according to claim 10, wherein calculating the patterning device design includes co-optimization between an illumination shape to be used in the lithographic apparatus and the features on the patterning device.

14. A method of manufacturing devices, wherein a device pattern is applied to a series of substrates using a lithographic apparatus and using a lithographic process, the method including performing the method according to claim 10, applying the device pattern onto a resist material using the patterning device, and developing the applied pattern and processing the substrate in accordance with the developed pattern, wherein the pattern is formed in the resist by a negative tone process.

15. The method of claim 10, wherein the distance between the respective edges of each pair of edges is at least 30% smaller than the size of the associate individual feature to be formed on the substrate once adjusted by a magnification factor, if any, of the lithographic apparatus.

16. A patterning device carrying a pattern of features to be transferred onto a target portion of a substrate using a lithographic apparatus and a resist process, at least an area of the patterning device being free of radiation absorber material, wherein the pattern of features in the area comprises a dense array of individual features of which the individual features are defined in at least one direction by pairs of edges between regions of different phase and wherein a distance between respective edges of each pair of edges in the one direction is at least 15% smaller than a size of an associated individual feature to be formed on the substrate once adjusted by a magnification factor, if any, of the lithographic apparatus.

17. The patterning device according to claim 16, wherein the distance between the respective edges of each pair of edges is at least 30% smaller than the size of the associate individual feature to be formed on the substrate once adjusted by a magnification factor, if any, of the lithographic apparatus.

18. The patterning device according to claim 16, wherein each individual feature in the area is defined by a pair of edges between regions having a phase different than that between the edges, the pair of edges formed by etching of a trench or pit feature into a multilayer reflective structure formed on a patterning device substrate, or wherein each individual feature in the area is defined by a pair of edges between regions having a phase different than that between the edges, the pair of edges formed by etching into a multilayer reflective structure formed on a patterning device substrate so as to leave a mesa feature.

19. The patterning device according to claim 16, comprising a multilayer reflective structure formed on a patterning device substrate, wherein features of the pattern are defined by etching the multilayer reflective structure in selected regions so as to impart substantially opposite phases to reflected radiation from etched and non-etched regions, taking into account a wavelength and angle of incidence to be used in the lithographic apparatus.

20. The patterning device according to claim 19, wherein reflectance in the etched regions is greater than 85% of that in non-etched regions.

21. The patterning device according to claim 16, configured to transfer the pattern using radiation having a wavelength selected from between 5 and 15 nanometers.

* * * * *